United States Patent
Niarfeix et al.

(10) Patent No.: US 9,157,725 B2
(45) Date of Patent: Oct. 13, 2015

(54) METHOD FOR PRODUCING A SENSOR UNIT, SENSOR UNIT AND INSTRUMENTED BEARING COMPRISING SUCH A SENSOR UNIT

(71) Applicants: Francois Niarfeix, Saint-Cyr (FR); Gertjan van Amerongen, Scherpenzeel (NL)

(72) Inventors: Francois Niarfeix, Saint-Cyr (FR); Gertjan van Amerongen, Scherpenzeel (NL)

(73) Assignee: AKTIEBOLAGET SKF, Gothenburg (SE)

( * ) Notice: Subject to any disclaimer, the term of this patent is extended or adjusted under 35 U.S.C. 154(b) by 147 days.

(21) Appl. No.: 13/916,839

(22) Filed: Jun. 13, 2013

(65) Prior Publication Data

US 2014/0021944 A1    Jan. 23, 2014

(30) Foreign Application Priority Data

Jun. 13, 2012   (EP) ..................................... 12305673

(51) Int. Cl.
*G01B 7/30* (2006.01)
*G01P 3/44* (2006.01)
*H05K 13/00* (2006.01)
*G01D 5/244* (2006.01)

(52) U.S. Cl.
CPC .............. *G01B 7/30* (2013.01); *G01D 5/24442* (2013.01); *G01P 3/443* (2013.01); *H05K 13/0023* (2013.01); *Y10T 29/49117* (2015.01)

(58) Field of Classification Search
CPC ................. G01B 7/30; G01P 3/48; G01P 3/54
USPC .......... 324/207.16, 207.17, 207.25, 173, 174, 324/658; 310/168; 318/661; 180/443; 702/145–155
See application file for complete search history.

(56) References Cited

U.S. PATENT DOCUMENTS

| 4,049,984 | A  | * | 9/1977  | Ishii et al. ..................... 310/112 |
| 5,309,094 | A  |   | 5/1994  | Rigaux et al. |
| 6,492,911 | B1 | * | 12/2002 | Netzer ..................... 340/870.37 |
| 6,879,149 | B2 | * | 4/2005  | Okada et al. .................. 324/174 |
| 8,368,389 | B2 | * | 2/2013  | Itomi ....................... 324/207.12 |
| 2005/0073299 | A1 | * | 4/2005  | Yoshikawa et al. ...... 324/207.25 |
| 2010/0309756 | A1 | * | 12/2010 | Kimura et al. ................ 368/293 |
| 2011/0241659 | A1 | * | 10/2011 | Braun et al. ............. 324/207.25 |
| 2012/0125106 | A1 |   | 5/2012  | Mai et al. |

FOREIGN PATENT DOCUMENTS

EP    0231385 A1    8/1987
EP    2675764 A1    12/2013

* cited by examiner

*Primary Examiner* — Jeff Natalini
*Assistant Examiner* — Steven Yeninas
(74) *Attorney, Agent, or Firm* — Bryan Peckjian; SKF USA Inc. Patent Dept.

(57) ABSTRACT

A method of producing a sensor unit for sensing the angular position of a rotatable element with respect to a fixed element, providing an encoder element fastened to the rotatable element, adapted to generate magnetic field variations as a function of its angular position, and a sensing element fastened to the fixed element, adapted to sense the magnetic field variations. The sensing element is mounted on and connected to a printed circuit board mounted in a shielding casing fastened with the fixed element. The method further comprises a step consisting in earthing the shielding casing by electrically connecting it to a load discharging device of the printed circuit board.

13 Claims, 3 Drawing Sheets

METHOD FOR PRODUCING A SENSOR UNIT, SENSOR UNIT AND INSTRUMENTED BEARING COMPRISING SUCH A SENSOR UNIT

CROSS-REFERENCE TO RELATED APPLICATIONS

This application claims priority to European patent application no. EP12305673 filed Jun. 13, 2012, the contents of which are fully herein incorporated by reference.

TECHNICAL FIELD OF THE INVENTION

The present invention concerns a method for producing a sensor unit, and a sensor unit for sensing the angular position of a rotatable element with respect to a fixed element which can be produced using such a method. The invention also concerns an instrumented bearing comprising such a sensor unit.

BACKGROUND OF THE INVENTION

Sensor units for sensing the angular position of a rotatable element often include induction sensors, for example known from U.S. Pat. No. 5,309,094, involving an encoder element, adapted to generate magnetic field variations, and a sensing element adapted to determine, on the basis of the magnetic field variations, the angular position of the rotating element. The data delivered by the sensing element are generally processed by electronic components integrated in a printed circuit board to which the sensing element is connected.

As this type of sensor unit is often used in assemblies including electrical motors, the sensing element and the printed circuit board are mounted in a shielding casing made of a metallic material, and adapted to protect the sensing element and the printed circuit board from too intense magnetic fields. As the shielding casing catches a substantially high portion of the magnetic fields that exist in its vicinity, it provokes electric potential differences between the shielding casing and the printed circuit board. These electric potential differences continuously increase and can reach a level at which electric arcs can occur and destroy some components of the printed circuit board.

SUMMARY OF THE INVENTION

The aim of the invention is to provide a new method for producing a sensor unit, which permits to make the electrical potential differences between the casing of the sensor body with the electronic components harmless to the printed circuit board.

To this end, the invention concerns a method for producing a sensor unit for sensing the angular position of a rotatable element with respect to a fixed element, comprising an encoder element fast with the rotatable element, adapted to generate magnetic field variations as a function of its angular position, and a sensing element fast with the fixed element, adapted to sense the magnetic field variations, the sensing element being connected to a printed circuit board mounted in a shielding casing fast with the fixed element. This method is characterized in that it comprises a step consisting in earthing the shielding casing by electrically connecting it to a load discharging device of the printed circuit board.

Thanks to the invention, the shielding casing is not at a random electric potential. This avoids potentially dangerous uncontrolled increases of its electric potential, and therefore prevents electronic components damages on the printed circuit board.

According to further aspects of the invention which are advantageous but not compulsory, such a method may incorporate one of several of the following features:

- The shielding casing is connected to the load discharging device of the printed circuit board by creating at least one protruding element on the shielding casing on at least one point aligned with at least one contact pad of the load discharging device.
- The or each protruding element is created by stamping a bottom wall of the shielding casing.
- The shielding casing is connected to the load discharging device of the printed circuit board by providing the load discharging device with at least one protruding contact pad adapted to make an electrical contact with a surface of the shielding casing.
- The shielding casing is connected to the load discharging device of the printed circuit board both by stamping the bottom wall of the shielding casing and providing the load discharging device with at least one protruding contact pad adapted to make an electrical contact with a corresponding stamped point of the bottom wall of the shielding casing.

The invention also concerns a sensor unit for sensing the angular position of a rotatable element with respect to a fixed element, comprising an encoder element which is fast with the rotatable element, adapted to generate magnetic field variations as a function of its angular position, and a sensing element fast with the fixed element, adapted to sense the magnetic field variations, the sensing element being connected to a printed circuit board mounted in a shielding casing fast with the fixed element. This sensor unit is characterized in that it comprises means to electrically connect the shielding casing to a load discharging device of the printed circuit board.

According to further aspects of the invention which are advantageous but not compulsory, such a sensor unit may incorporate one of several of the following features:

- A wall of the shielding casing comprises at least one stamped finger protruding towards the printed circuit board and making an electrical contact with a contact pad of the load discharging device.
- Each stamped finger protrudes from the surface of the wall of the shielding casing by a distance comprised between 0.1 and 5 millimeters.
- The load discharging device comprises at least one pad protruding towards a surface of the shielding casing.
- Each protruding pad is made of tin.

The invention also concerns an instrumented bearing comprising a bearing including a fixed ring and a rotating ring, and a sensor unit as mentioned here-above, whereas the encoder element is fast with the rotating ring and the sensing element is fixed to the fixed ring.

Advantageously, the bearing is of the rolling type and comprises rolling elements located between the fixed ring and the rotating ring.

BRIEF DESCRIPTION OF THE DRAWINGS

The invention will now be explained in correspondence with the annexed figures, as an illustrative example. In the annexed figures.

DETAILED DESCRIPTION OF THE INVENTION

Figure 1:
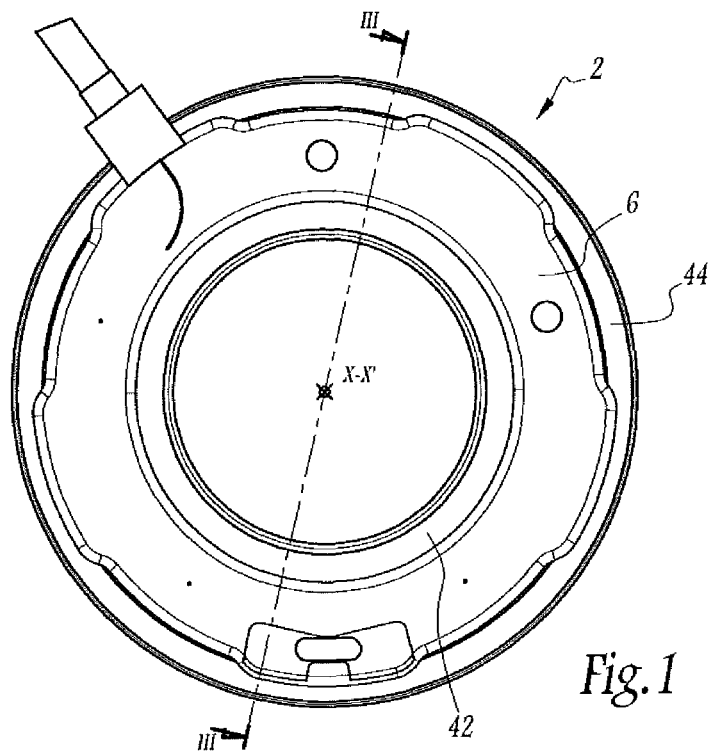
FIG. 1 is a front view of an instrumented bearing according to the invention.
Figure 2:
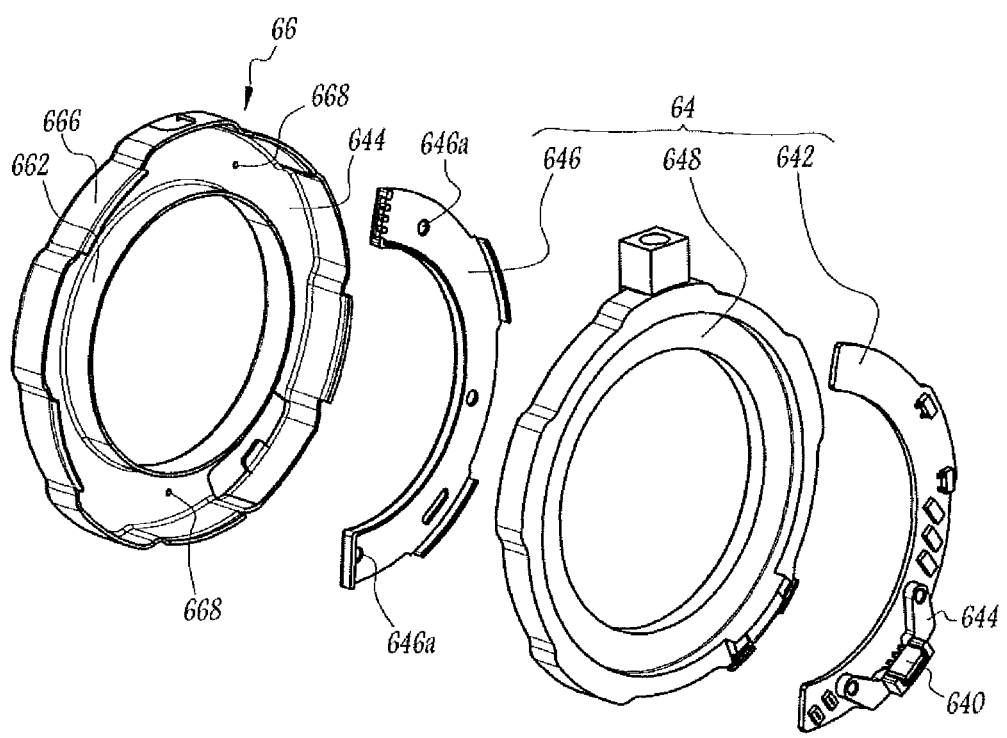
FIG. 2 is an exploded perspective view of a sensor body and a shielding casing belonging to a sensor unit according to the invention.
Figure 3:
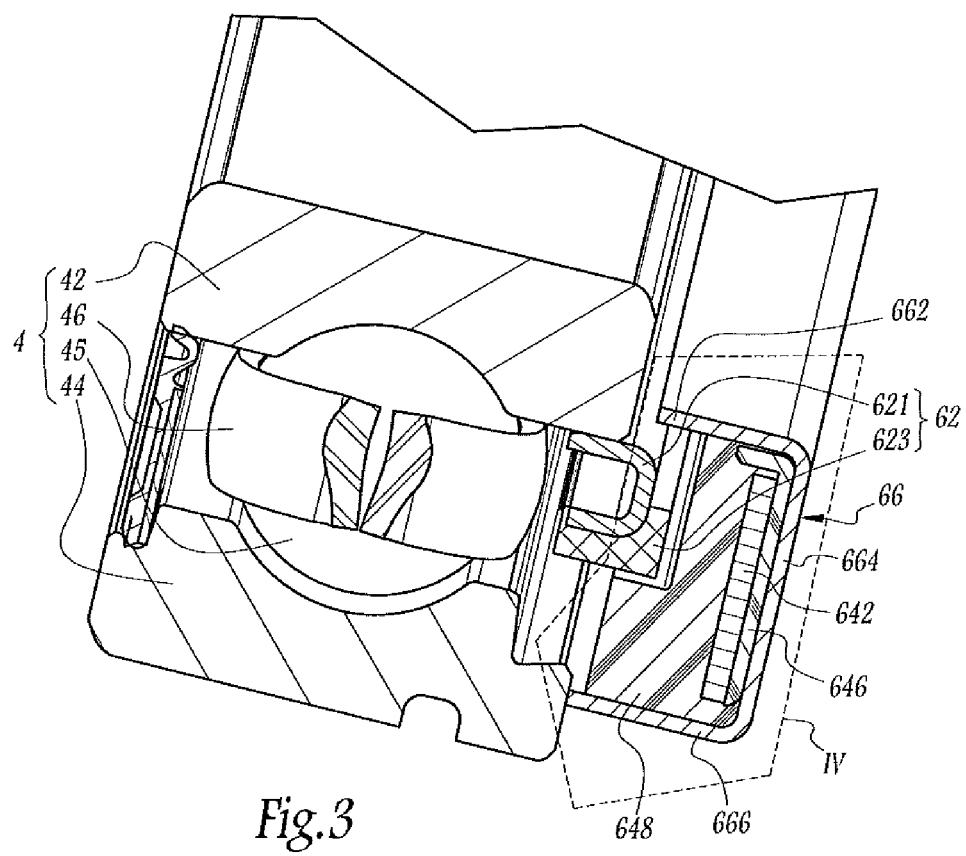
FIG. 3 is a partial sectional view of the instrumented bearing of FIG. 1 along plane III-III.

The instrumented bearing 2 represented on the figures comprises a rolling bearing 4 including a rotating inner ring 42 and a fixed outer ring 44. Between inner ring 42 and outer ring 44 are located balls 45 mounted in a cage 46. A radial gap is formed in between the inner ring 42 and the outer ring 46. In a non-shown embodiment, rolling bearing 4 may comprise other types of rolling element, such as rollers or needles.

Inner ring 42 is rotatable with respect to outer ring 44 around a central rotation axis X-X' of rolling bearing 4.

Instrumented bearing 2 also comprises a sensor unit 6. Sensor unit 6 comprises an encoder element 62, fast with inner ring 42 and adapted to generate magnetic field variations as a function of its angular position. Encoder element 62 comprises a frame 621 and a magnetic ring 623. Magnetic ring 623 is fixed to frame 621, which is fixed to inner ring 42.

Sensor unit 6 further comprises a sensor body 64, which is mounted in a shielding casing or yoke 66 fixed to the outer ring 44. Sensor body 64 comprises a sensing element 640. Sensing element 640 is a transducer adapted to sense the magnetic field variations generated by the rotation of the magnetic ring 623 around axis X-X'. Sensing element 640 has a substantially parallelepiped shape extending parallel to axis X-X' and faces magnetic ring 623 along a radial direction.

Sensing element 640 is mounted on and connected to a printed circuit board or PCB 642 thanks to a support member 644. PCB 642 is mounted in shielding casing 66. Shielding casing 66 is an annular shaped metallic part centred on axis X-X' and which comprises an inner cylindrical wall 662, a radial bottom wall 664 perpendicular to axis X-X' and an outer cylindrical wall 666. Wall 662 and 666 are centred on and parallel to axis X-X'. Shielding casing 66 is made of steel having a high magnetic permeability. Shielding casing 66 is preferably configured to extend over the radial gap between the fixed element and the rotatable element and to enclose the printed circuit board except for a side of the printed circuit board facing the fixed element or outer ring 46.

PCB 642 has a half-annular shape corresponding to the shape of shielding casing 66 and is mounted against bottom wall 664. As an optional feature, sensor body 64 may comprise a support plate 646, on which PCB 642 is mounted, support plate 646 being mounted against bottom wall 664 of shielding casing 66. Sensing element 640, support member 644, PCB 642 and support plate 646 are over moulded in a layer 648 of plastic material injected in shielding casing 66.

Figure 4:
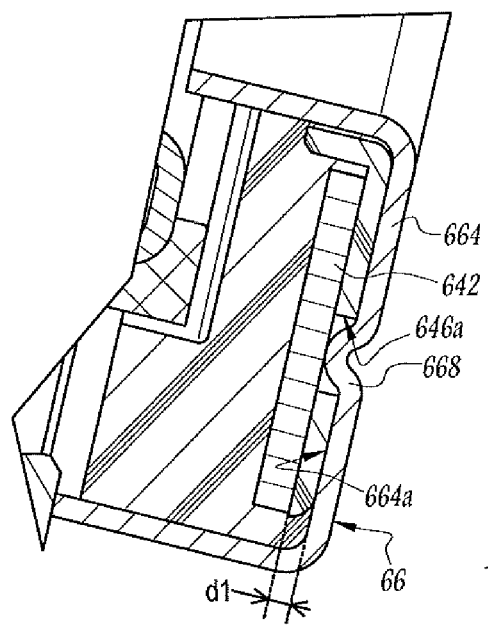
FIG. 4 is a view of a first embodiment of the invention.

In order to avoid too large electric potential differences between shielding casing 66 and rolling bearing 4 and PCB 642, shielding casing 66 is earthed by electrically connecting it to PCB 642. A first embodiment is represented on FIG. 4. In this embodiment, the electrical connection between shielding casing 66 and PCB 642 is obtained with a stamped finger 668 which forms an element protruding towards printed circuit board 642. Stamped finger 668 makes an electrical contact with a non-shown load discharging device implemented in PCB 642.

Stamped finger 668 can be realized using a spike shaped punch. Each stamped finger 668 protrudes from an internal surface 664a of bottom wall 664 by a distance d1 comprised between 0.1 and 5 mm.

Advantageously, shielding casing 66 comprises several stamped fingers 668 electrically connected to printed circuit board 642 at various locations of PCB 642.

Figure 5:
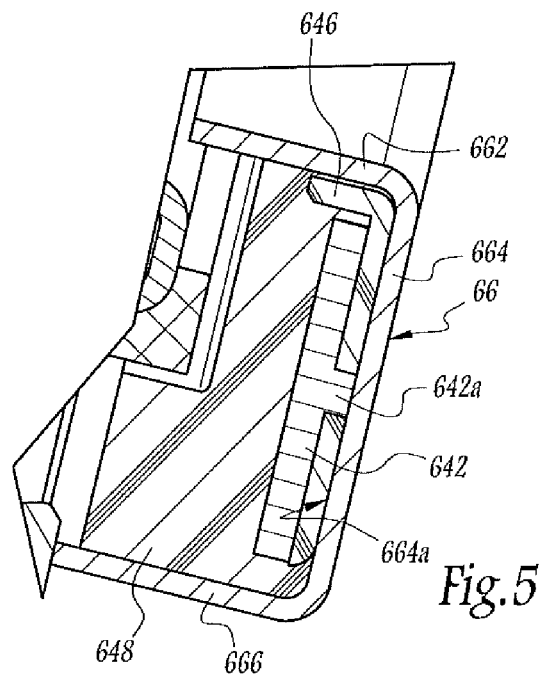
FIGS. 5 and 6 are views similar to FIG. 4, respectively for a second and a third embodiment of the invention.

A second embodiment of the invention is represented on FIG. 5. In this embodiment, elements similar to the first embodiment have the same references and work in the same way. Shielding casing 66 does not comprise any stamped finger 668. In this case, the electrical connection between PCB 642 and shielding casing 66 is obtained by providing the load discharging device with at least one contact pad 642a protruding towards bottom wall 664 and making a contact with surface 664a.

In this case, contact pad 642a protrudes from PCB by a distance equal to distance d1. Contact pad 642a is preferably made of tin, in order to facilitate its shaping.

Figure 6:
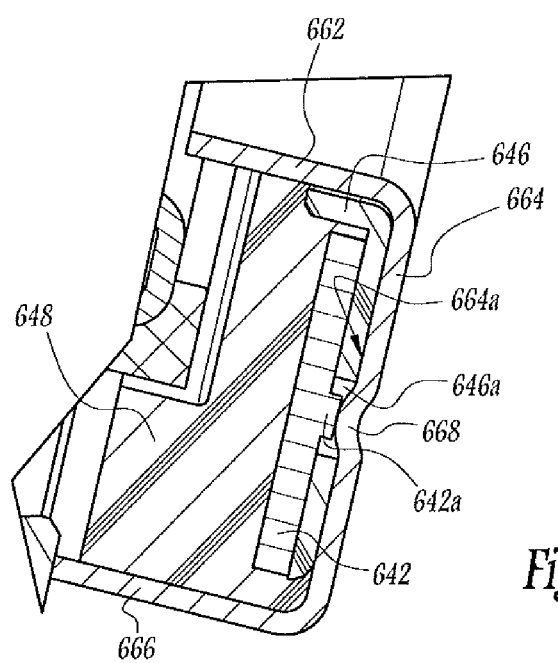

A third embodiment of the invention is represented on FIG. 6. This embodiment combines the techniques used in the first and the second embodiments. In other words, the electrical contact is made both by providing the load discharging device with a protruding contact pad 642a and by creating one or more stamped fingers 668 on shielding casing 66. The contact pads 642a and the stamped fingers 668 make an electrical contact with each other.

A hole 646a is provided in support plate 646 to permit the protrusion of stamped fingers 668 and the passage of contact pad 642a towards shielding casing 666 through support place 646. Holes 646a are provided at each area where shielding casing 66 is electrically connected to PCB 642.

According to a non-shown embodiment of the invention, sensor body 64 may not comprise any support plate 646. In such a case, PCB 642 is mounted in shielding casing 66 with a mounting clearance.

The invention claimed is:

1. A method for producing a sensor unit for sensing the angular position of a rotatable element with respect to a fixed element, comprising, the fixed element being spaced from the rotatable element by a radial gap, an encoder element rotatably fastened to the rotatable element, adapted to generate magnetic field variations as a function of its angular position, and a sensing element fastened to the fixed element, adapted to sense the magnetic field variations, the sensing element being mounted on and connected to a printed circuit board mounted in a shielding casing fastened to the fixed element such that the shielding housing is configured to directly contact the printed circuit board to facilitate electrical communication therebetween, the shielding casing being configured to extend over the radial gap between the fixed element and the rotatable element and to enclose the printed circuit board except for a side of the printed circuit board facing the fixed element, the method comprising the step of earthing the shielding casing by electrically connecting it to a load discharging device of the printed circuit board.

2. The method according to claim 1, wherein the shielding casing is connected to the load discharging device of the printed circuit board by creating at least one protruding element on the shielding casing on at least one point aligned with at least one contact pad of the load discharging device.

3. The method according to claim 2, wherein the at least one protruding element is created by stamping a bottom wall of the shielding casing.

4. The method according to claim 3, wherein the shielding casing is connected to the load discharging device of the printed circuit board by providing the load discharging device with the at least one protruding contact pad adapted to make an electrical contact with a surface of the shielding casing.

5. The method according to claim 4, wherein the shielding casing is connected to the load discharging device of the printed circuit board both by the at least one protruding element of the shielding casing and by providing the load discharging device with the at least one protruding contact pad adapted to make an electrical contact with the at least one protruding element of the shielding casing.

6. A sensor unit for sensing the angular position of a rotatable element with respect to a fixed element, the sensor unit comprising:
- the fixed element being spaced from the rotatable element by a radial gap,
- an encoder element fastened to the rotatable element, adapted to generate magnetic field variations as a function of its angular position, and
- a sensing element fastened to the fixed element, adapted to sense the magnetic field variations, the sensing element being connected to a printed circuit board mounted in a shielding casing fastened to the fixed element such that the shielding housing is configured to directly contact the printed circuit board to facilitate electrical communication therebetween,
- the shielding casing being configured to extend over the radial gap between the fixed element and the rotatable element and to enclose the printed circuit board except for a side of the printed circuit board facing the fixed element,
- means to electrically connect the shielding casing to a load discharging device of the printed circuit board.

7. The sensor unit according to claim 6, wherein a wall of the shielding casing provides at least one stamped finger protruding towards the printed circuit board and making an electrical contact with a contact pad of the load discharging device.

8. The sensor unit according to claim 7, wherein the at least one stamped finger protrudes from the surface of the wall of the shielding casing by a distance (d1) comprised between 0.1 and 5 millimeters.

9. The sensor unit according to claim 8, wherein the load discharging device includes the at least one contact pad protruding towards a surface of the shielding casing.

10. The sensor unit according to claim 9, wherein the at least one contact pad is made of tin.

11. The sensor unit according to claim 10, further comprising a support plate for the printed circuit board, the support plate being mounted in the shielding casing, and wherein
the support plate provides holes at each area where the shielding casing is connected to the printed circuit board.

12. An instrumented bearing, comprising:
a bearing including a fixed ring and a rotating ring, the fixed ring being spaced from the rotating ring by a radial gap, and
a sensor unit having a wall of a shielding casing that provides at least one stamped finger protruding towards a printed circuit board and making an electrical contact with a contact pad of a load discharging device, wherein
the shielding casing is configured to directly contact the printed circuit board to facilitate electrical communication therebetween,
the shielding casing being configured to extend over the radial gap between the fixed ring and the rotating ring and to enclose the printed circuit board except for a side of the printed circuit board facing the fixed ring, wherein
an encoder element is fastened to the rotating ring and a sensing element is fixed to the fixed ring.

13. The instrumented bearing according to claim 12, wherein the bearing is of the rolling type and comprises rolling elements located between the fixed ring and the rotating ring.

* * * * *